United States Patent
Kanada et al.

(10) Patent No.: US 6,372,808 B1
(45) Date of Patent: Apr. 16, 2002

(54) PROCESS FOR PRODUCING POROUS POLYIMIDE AND POROUS POLYIMIDE

(75) Inventors: Mitsuhiro Kanada; Takayuki Yamamoto; Amane Mochizuki; Takahiro Fukuoka, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/984,416

(22) Filed: Oct. 30, 2001

(30) Foreign Application Priority Data

Nov. 13, 2000 (JP) ........................................ 2000-345617

(51) Int. Cl.$^7$ ................. C08J 9/26; C08J 9/28
(52) U.S. Cl. .................... 521/64; 521/61; 521/62; 521/63; 521/77; 521/184; 521/189
(58) Field of Search ............................. 521/61, 62, 63, 521/64, 77, 184, 189

(56) References Cited

U.S. PATENT DOCUMENTS

| | | | | |
|---|---|---|---|---|
| 3,883,452 A | * | 5/1975 | Scheuerlein et al. | 521/77 |
| 4,113,628 A | * | 9/1978 | Alegranti | 521/61 |
| 5,700,844 A | * | 12/1997 | Hedriick et al. | 521/77 |
| 5,726,211 A | * | 3/1998 | Hedrick et al. | 521/64 |
| 5,804,607 A | * | 9/1998 | Hedrick et al. | 521/64 |

\* cited by examiner

*Primary Examiner*—Morton Foelak
(74) *Attorney, Agent, or Firm*—Sughrue Mion, PLLC

(57) ABSTRACT

A porous polyimide having a finely cellular structure and having a low dielectric constant and heat resistance. The porous polyimide can be produced by a process comprising adding a dispersible compound to a polyimide precursor to form a micro-domain structure in which the dispersible compound is dispersed in the polymer so as to have a size smaller than 10 μm and then removing the dispersible compound by extraction with supercritical carbon dioxide to thereby make the precursor porous, wherein the interaction parameter $\chi_{AB}$ between the polyimide precursor A and the dispersible compound B is larger than 3. This porous polyimide has an average cell diameter smaller than 5 μm and a dielectric constant of 3 or lower.

4 Claims, 1 Drawing Sheet

PROCESS FOR PRODUCING POROUS POLYIMIDE AND POROUS POLYIMIDE

FIELD OF THE INVENTION

The present invention relates to a process for producing a heat-resistant porous polyimide having a finely cellular structure and to a porous polyimide obtained by the process. This porous polymer is extremely useful as, for example, circuit substrates for electronic appliances, etc.

DESCRIPTION OF THE RELATED ART

Polyimide resins have conventionally been used widely as parts or members required to have reliability, such as circuit substrates for electronic/electrical appliances and other electronic parts, because of their features such as high insulating properties, dimensional stability, moldability, and light-weight properties. Especially in recent years, there is a desire for higher-speed information transmission with the trend toward performance and function advancement in electrical/electronic appliances, and members for use in these appliances also are required to be compatible with the desired higher-speed information transmission. The polyimides for use in such applications are also required to have a lower dielectric constant and a smaller dielectric dissipation factor as electrical properties necessary for the higher-speed transmission.

In general, the dielectric constant of a plastic material is determined by the molecular framework thereof. This means that a technique which may be effective in reducing dielectric constant is to modify a molecular framework. However, in view of the fact that the dielectric constants of polyethylene and polytetrafluoroethylene, which are regarded as low-dielectric-constant polymers, are about 2.3 and about 2.1, respectively, there are limitations in the technique of controlling dielectric constant based on molecular structure modifications. In addition, the above technique poses problems, for example, that a molecular structure modification results in changes in properties such as film strength and coefficient of linear expansion.

As other attempts to obtain a lower dielectric constant, various techniques have been proposed in which a plastic material is made porous so as to utilize air, which has a dielectric constant of 1, and to control the dielectric constant of the plastic based on the porosity.

Conventional techniques for obtaining general porous polymers include dry processes and wet processes. Known dry processes include a physical foaming method and a chemical foaming method. In the physical foaming method, a low-boiling solvent such as, e.g., a chlorofluorocarbon or hydrocarbon is dispersed as a blowing agent into a polymer and this polymer is then heated to volatilize the blowing agent. Thus, cells are formed to obtain a porous polymer.

In the chemical foaming method, a blowing agent is added to a polymer and then pyrolized. Thus, a gas is generated to form cells and thereby obtain a foam.

The physical foaming technique has problems concerning the harmfulness of the substances to be used as blowing agents and various influences thereof on the environment, e.g., ozonosphere depletion. In addition, although the physical technique is generally suitable for use in producing foams having a cell diameter of tens of micrometers or larger, it is difficult with this technique to obtain a foam having fine cells with uniformity in diameter. On the other hand, the chemical foaming technique has a drawback that the blowing agents, after gas generation and foaming, leave residues in the resultant foams. Such corrosive gases and impurities pose a problem concerning pollution especially in applications such as electronic parts, where pollution reduction is highly required.

Recently, a technique for obtaining a porous object having a small cell diameter and a high cell density has been proposed. This technique comprises dissolving an inert gas such as nitrogen or carbon dioxide in a polymer at a high pressure, subsequently releasing the polymer from the pressure, and heating the polymer to around the glass transition temperature or softening point thereof to thereby form cells. This foaming technique, in which cells are formed by generating nuclei from the gas in a thermodynamically unstable state and then expanding and growing the nuclei, has an advantage that a foam having microporosity which has been unobtainable so far can be obtained.

In JP-A-6-322168 (the term "JP-A" as used herein means an "unexamined published Japanese patent application") is proposed a process for producing a heat-resistant foam by applying the technique described above to a polyetherimide as a thermoplastic polymer. However, this process has the following drawback. When a polymer is impregnated with a high-pressure gas in a pressure vessel, the pressure vessel is heated to or around the Vicat softening point of the polymer. Because of this heating, the polymer is in a molten state during pressure reduction and, hence, the high-pressure gas readily expands. As a result, the foam obtained has a cell size as large as from 10 to 300 μm. Consequently, this foam, when intended to be used as a circuit substrate, needs to have a large thickness and imposes limits on the formation of finer patterns.

On the other hand, JP-A-10-45936 proposes a technique of forming a foamed molding having closed cells with a cell size of from 0.1 to 20 μm by likewise applying that technique to a styrene resin having a syndiotactic structure, and further proposes use of the foamed molding as an electric circuit member. However, since styrene resins having a syndiotactic structure generally have a glass transition point around 100° C., this foamed molding deforms or bends when used at temperatures of 100° C. or higher. Consequently, this foamed molding is usable only in a limited range of applications. Furthermore, in the techniques for imparting porosity by physical or chemical foaming, there is a possibility that the polymer being foamed might suffer delamination. None of the references cited above discloses use of a polyimide.

SUMMARY OF THE INVENTION

One object of the invention is to provide a process for producing a porous polyimide having a finely cellular structure and having a low dielectric constant and heat resistance.

Another object of the invention is to provide the porous polyimide.

The present inventors made investigations in order to overcome the problems described above. As a result, they have found that when a dispersible compound for forming a discontinuous phase is added to a polyimide precursor serving as a continuous phase to form a specific micro-domain structure in the polymer and is subsequently removed therefrom by, for example, an extraction operation with supercritical carbon dioxide or the like, then a porous object having extremely fine cells and a low dielectric constant can be obtained. The invention is based on this finding.

The invention provides a process for producing a porous polyimide which comprises preparing a polymer composition having a micro-domain structure made up of a continuous phase comprising a polyimide precursor A and, dispersed therein, a discontinuous phase which comprises a dispersible compound B and has an average diameter smaller than 10 μm, removing the dispersible compound B from the polymer composition, and then converting the polyimide precursor A into a polyimide, an interaction parameter $\chi_{AB}$ between the polyimide precursor A and the dispersible compound B being larger than 3.

In the process described above, the removal of the dispersible compound B may be conducted by an extraction operation. In this case, it is preferred to use supercritical carbon dioxide as an extraction solvent.

The invention further provides a porous polyimide which is obtained by the above process and has an average cell diameter smaller than 5 μm and a dielectric constant of 3 or lower.

DETAILED DESCRIPTION OF THE INVENTION

Figure 1:
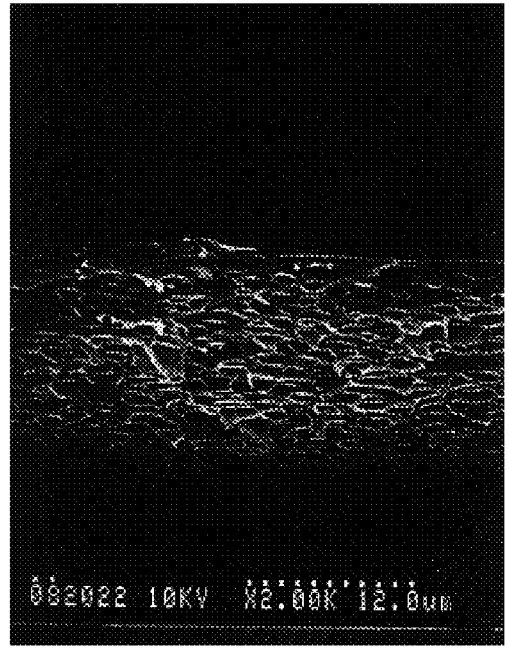
FIG. 1 is a scanning electron photomicrograph of a section of the film obtained in Example 1.
Figure 2:
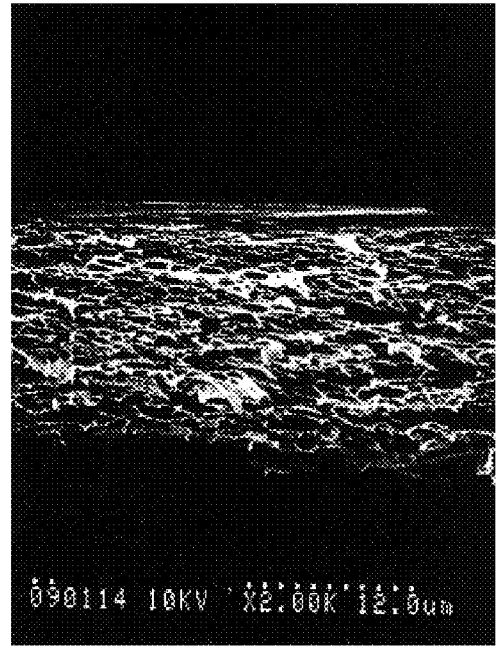
FIG. 2 is a scanning electron photomicrograph of a section of the film obtained in Example 2.
Figure 3:
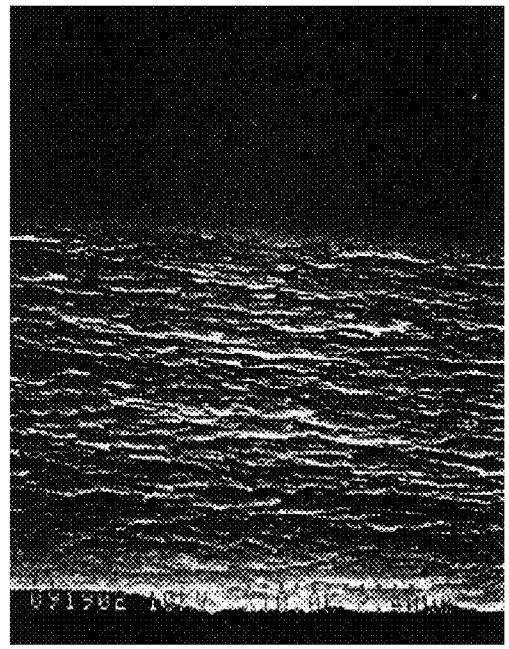
FIG. 3 is a scanning electron photomicrograph of a section of the film obtained in Comparative Example 1.
Figure 4:
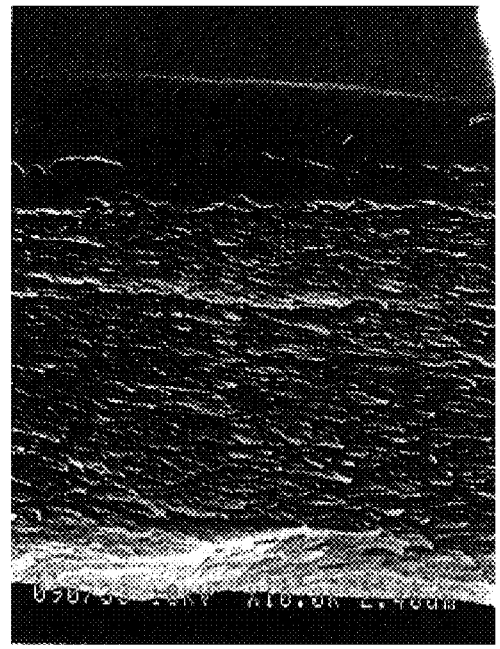
FIG. 4 is a scanning electron photomicrograph of a LgL section of the film obtained in Comparative Example 2.

The polyimide precursor A to be used in the invention is not particularly limited as long as it is an intermediate convertible into a polyimide. It can be obtained by known or common methods. For example, the polyimide precursor A can be obtained by reacting an organic tetracarboxylic dianhydride with a diamino compound (diamine).

Examples of the organic tetracarboxylic dianhydride include pyromellitic dianhydride, 3,3',4,4'-biphenyltetracarboxylic dianhydride, 2,2-bis(2,3-dicarboxyphenyl)-1,1,1,3,3,3-hexafluoropropane dianhydride, 2,2-bis(3,4-dicarboxyphenyl)-1,1,1,3,3,3-hexafluoropropane dianhydride, 3,3',4,4'-benzophenonetetracarboxylic dianhydride, bis(3,4-dicarboxyphenyl)ether dianhydride, and bis(3,4-dicarboxyphenyl)sulfone dianhydride. These organic tetracarboxylic dianhydrides may be used alone or in combination of two or more thereof.

Examples of the diamino compound include m-phenylenediamine, p-phenylenediamine, 3,4'-diaminodiphenyl ether, 4,4'-diaminodiphenyl ether, 4,4'-diaminodiphenyl sulfone, 3,3'-diaminodiphenyl sulfone, 2,2-bis(4-aminophenoxyphenyl)propane, 2,2-bis(4-aminophenoxyphenyl)hexafluoropropane, 1,3-bis(4-aminophenoxy)benzene, 1,4-bis(4-aminophenoxy)benzene, 2,4-diaminotoluene, 2,6-diaminotoluene, diaminodiphenylmethane, 4,4'-diamino-2,2'-dimethylbiphenyl, and 2,2-bis(trifluoromethyl)-4,4'-diaminobiphenyl. These diamino compounds may be used alone or in combination of two or more thereof.

The polyimide precursor A can be obtained by reacting an organic tetracarboxylic dianhydride with a diamino compound (diamine) usually in an organic solvent at from 0 to 90° C. for from 1 to 24 hours. Examples of the organic solvent include polar solvents such as N-methyl-2-pyrrolidone, N,N-dimethylacetamide, N,N-dimethylformamide, and dimethyl sulfoxide.

The dispersible compound B to be used in the invention for constituting the discontinuous phase (corresponding to the pores of the porous object to be produced) in the micro-domain structure is an ingredient which is dispersible upon mixing with the polyimide precursor A. This dispersible compound B is not particularly limited as long as it is a compound which is capable of separating as fine particles from the polyimide precursor A to form a sea-island micro-domain structure and which satisfies a requirement that the interaction parameter $\chi_{AB}$ between the polyimide precursor A and this dispersible compound B is larger than 3 (e.g., $3<\chi_{AB}<30$). Preferably, the dispersible compound B is an ingredient capable of being removed from the polyimide precursor A by extraction with supercritical carbon dioxide.

Interaction parameter $\chi_{AB}$ in the invention can be calculated with a computer using the following Van Krevelen equation (1).

$$\chi_{AB}=0.34+(V_B/RT)(\delta_B-\delta_A)^2 \qquad (1)$$

The solubility parameter of the polyimide precursor A ($\delta_A$), the solubility parameter of the dispersible compound B ($\delta_B$), and the term dissolution entropy for the polyimide precursor A and dispersible compound B $[(\delta^B-\delta_A)^2]$ can be calculated by determining the energetically stable structure of the molecule of each ingredient by molecular mechanics and then using the three-dimensional atomic-group contribution method. $\chi_{AB}$ is the interaction parameter (-) between A and B; $\delta_A$ and $\delta^B$ are the solubility parameters ($J^{1/2}/cm^{3/2}$) of A and B, respectively; $V_B$ is the molar volume ($cm^3/mol$) of the dispersible compound; R is the gas constant (J/K.mol); and T is the absolute temperature (K).

Any compound satisfying the above-described requirement concerning interaction parameter may be used as the dispersible compound B. Examples thereof include polyalkylene glycols such as polyethylene glycol and polypropylene glycol; such polyalkylene glycols terminated at one or each end by methyl or terminated at one or each end by (meth)acrylate; compounds formed by terminating one end of a polyalkylene glycol by an alkyl or aryl group and terminating the other end by (meth)acrylate, such as phenoxypolyethylene glycol (meth)acrylate; urethane prepolymers; polyhydric alcohol poly(meth)acrylates such as trimethylolpropane tri(meth)acrylate and dipentaerythritol hexa (meth)acrylate; and other (meth) acrylate compounds such as ξ-caprolactone (meth)acrylate, urethane (meth)acrylates, epoxy (meth)acrylates, and oligoester (meth)acrylates. These compounds may be used alone or in combination of two or more thereof.

The polymer composition having a micro-domain structure in the invention can be formed by a common or known technique. For example, the polyimide precursor A and the dispersible compound B in a given proportion are dissolved in a solvent (usually, an organic solvent) and this solution is formed into a desired shape(e.g.,a sheet or film). Thereafter, the solvent is removed by drying to thereby insolubilize the dispersible compound B contained in the polyimide precursor A. Thus, a in a solvent are in a completely compatibilized state when the amount of the dispersible compound B added is, for example, within the range shown above. In this case, the drying for solvent removal in the above method does not result in the formation of a micro-domain structure. Because of this, even when this polyimide precursor A is thereafter converted to a polyimide through dehydrating cyclization by heat treatment, etc., the resultant polyimide does not have a porous structure.

Subsequently, the dispersible compound B is removed from the polymer composition having a micro-domain structure consisting of the polyimide precursor A and the dispersible compound B, whereby a porous structure is formed. Methods for removing the dispersible compound B are not particularly limited, and vaporization, decomposition, or the like may be used. It is, however, preferred to remove the compound B by an extraction operation. The removal by an extraction operation may be accompanied by decomposition or alteration of the decomposable compound B, or may be conducted after decomposition or alteration of the compound B.

Any solvent capable of dissolving the dispersible compound B therein can be used for the extraction of the dispersible compound B without particular limitations. However, carbon dioxide, in particular, supercritical carbon dioxide, is preferred from the standpoints of removing ability and harmlessness. The removal of the dispersible compound B from the polymer composition with supercritical carbon dioxide may be conducted at any temperature not lower than the critical polymer composition can be obtained which has a micro-domain structure consisting of a continuous phase made of the polyimide precursor A and, dispersed therein, a discontinuous phase made of the dispersible compound B having an average diameter smaller than 10 $\mu$m. The drying temperature for solvent removal varies depending on the kind of the solvent used, but is generally from 40 to 250° C., preferably from 60 to 200° C. If the drying temperature is higher than 250° C., there are cases where imidization of the polyimide precursor A begins. Even if the polyimide precursor A constituting the continuous phase and the dispersible compound B constituting the discontinuous phase react with each other to form bonds during the drying, this poses no problem as long as the discontinuous phase can be removed later.

The amount of the dispersible compound B to be added is usually preferably 200 parts by weight or smaller per 100 parts by weight of the polyimide precursor A, from the standpoint of forming a micro-domain structure having a dispersed-phase diameter smaller than 10 $\mu$m. From the standpoint of attaining a porosity necessary for enabling the porous object to have a dielectric constant of 3 or lower, the amount of the dispersible compound B to be added is preferably 10 parts by weight or larger per 100 parts by weight of the polyimide precursor A.

If the interaction parameter $\chi_{AB}$ between the polyimide precursor A and the dispersible compound B is 3 or smaller, the polyimide precursor A and dispersible compound B dissolved point for supercritical carbon dioxide. It is, however, preferred to use a temperature in the range where imidization of the polyimide precursor A does not proceed excessively during the removal. As the temperature rises, the solubility of the dispersible compound B in supercritical carbon dioxide decreases. Consequently, the temperature (extraction temperature) at which the dispersible compound B is removed with supercritical carbon dioxide is preferably from 32 to 230° C., more preferably from 40 to 200° C.

The pressure of the supercritical carbon dioxide is not particularly limited as long as it is not lower than the critical point for supercritical carbon dioxide. However, it is preferably from 7.3 to 100 MPa, more preferably from 10 to 50 MPa.

After being pressurized, supercritical carbon dioxide may be continuously supplied with a constant delivery pump to a pressure vessel containing the polymer composition having a micro-domain structure. Alternatively, supercritical carbon dioxide pressurized to a given pressure may be introduced into the pressure vessel. The time necessary for extraction varies depending on extraction temperature, extraction pressure, and the amount of the dispersible compound B added to the polyimide precursor A. However, the extraction time may be about from 1 to 10 hours.

Thus, the polyimide precursor A is made porous by removing the dispersible compound B. Thereafter, this polyimide precursor A is converted to a porous polyimide by, for example, a dehydrating cyclization reaction. The dehydrating cyclization reaction of the polyimide precursor A may be conducted by, for example, heating the precursor to about 300 to 400° C. or by causing a dehydrating-cyclization agent, such as a mixture of acetic anhydride and pyridine, to act on the precursor.

By the process described above, a porous polyimide can be obtained which contains no or only a slight amount of residues of the dispersible compound. The porous polyimide thus obtained has a cell size as small as below 10 $\mu$m and, hence, a dielectric constant of 3 or lower and further has high heat resistance. In particular, the process of the invention is capable of yielding a heat-resistant porous object having an average cell diameter smaller than 5 $\mu$m (e.g., from 0.1 to 5 $\mu$m, preferably from 0.1 to 2 $\mu$m, more preferably from 0.1 to 1 $\mu$m) and a dielectric constant of 3 or lower (e.g., from 1.5 to 3), which has been difficult to obtain by any conventional process. This porous object is extremely advantageously utilizable as, e.g., an internal insulator, buffering material, or circuit substrate in electronic appliances, etc., while taking advantage of excellent properties possessed by polyimide resins, such as heat resistance and mechanical properties.

The invention will be explained below in more detail by reference to Examples, but the invention should not be construed as being limited to these Examples in any way.

Method For Determination of Dielectric Constant

Dielectric constant was determined with HP 4284A Precision LCR Meter, manufactured by Yokogawa-Hewlett-Packard, Ltd.

Method For Examination of Internal Structure of Polyimide Film

A porous object film produced was frozen in liquid nitrogen and broken. A resultant section was examined with a scanning electron microscope (SEM) (Hitachi S-570) at an accelerating voltage of 10 kV.

Synthesis Example 1

Synthesis of Polyimide Precursor ([BPDA/6FDA]/PDA)

16.2 g (0.15 mol) of p-phenylenediamine (PDA) and 227 g of N-methyl-2-pyrrolidone (NMP) were introduced into a four-necked flask having a capacity of 500 ml equipped with a stirrer and a thermometer. The contents were stirred to dissolve the PDA. Subsequently, 39.7 g (0.135 mol) of 3,3',4,4'-biphenyltetracarboxylic dianhydride (diphthalic dianhydride; BPDA) and 3.0 g (0.015 mol) of 2,2-bis(3,4-dicarboxyphenyl)hexafluoropropane dianhydride (6FDA) were added to the solution. The resulting mixture was continuously stirred at room temperature for 2 hours to obtain a polyimide precursor solution.

EXAMPLE 1

A polyethylene glycol monomethacrylate (trade name "PE-350", manufactured by Nippon Oil & Fats Co., Ltd.) having a weight average molecular weight of 420 was added to the polyimide precursor solution obtained in Synthesis Example 1, in an amount of 38 parts by weight per 100 parts by weight of the polyimide precursor. The resulting mixture was stirred to obtain a transparent homogeneous solution. This solution was applied to a 25 $\mu$m-thick stainless-steel foil (SUS304) with a spin coater in such an amount as to result in a polyimide precursor film having a thickness of 15 μm on a dry basis. The coating was dried in a circulating hot-air oven first at 90° C. for 15 minutes and then at 180° C. for 10 minutes to remove the solvent. Thus, a polyimide precursor film was obtained which had a micro-domain structure containing the polyethylene glycol monomethacrylate.

This polyimide precursor film was cut into a sheet having dimensions of 50 mm by 100 mm. This sheet was placed in a 500 ml pressure vessel, and the vessel was filled with supercritical carbon dioxide pressurized to 25 MPa in a 100° C. atmosphere. Thereafter, supercritical carbon dioxide was injected into and discharged from the vessel at a rate of about 5 liters/min in terms of gas amount while maintaining the pressure. This operation for extracting the polyethylene glycol monomethacrylate was conducted for 2 hours.

The polyimide precursor film thus treated was heated to 380° C. at a reduced pressure of 1.33 Pa to obtain a porous polyimide film having a thickness of 10 μm. An SEM image of a section of the porous object film obtained was processed to determine the cell size (average cell diameter), which was found to be 0.84 μm. This porous object film had a dielectric constant ξ of 2.64 (measuring frequency, 1 MHz). The interaction parameter $\chi_{AB}$ between the polyimide precursor and dispersible compound (polyethylene glycol monomethacrylate) used here was 4.24.

EXAMPLE 2

A polyethylene glycol diacrylate (trade name "A-600", manufactured by Shin-Nakamura Chemical Co., Ltd.) having a weight average molecular weight of 600 was added to the polyimide precursor solution obtained in Synthesis Example 1, in an amount of 38 parts by weight per 100 parts by weight of the polyimide precursor. The resulting mixture was stirred to obtain a transparent homogeneous solution. This solution was applied to a 25 μm thick stainless-steel foil (SUS304) with a spin coater in such an amount as to result in a polyimide precursor film having a thickness of 15 μm on a dry basis. The coating was dried in a circulating hot-air oven first at 90° C. for 15 minutes and then at 180° C. for 10 minutes to remove the solvent. Thus, a polyimide precursor film was obtained which had a micro-domain structure containing the polyethylene glycol diacrylate.

This polyimide precursor film was cut into a sheet having dimensions of 50 mm by 100 mm. This sheet was placed in a 500 ml pressure vessel, and the vessel was filled with supercritical carbon dioxide pressurized to 25 MPa in a 100° C. atmosphere. Thereafter, supercritical carbon dioxide was injected into and discharged from the vessel at a rate of about 3 liters/min in terms of gas amount while maintaining the pressure. This operation for extracting the polyethylene glycol diacrylate was conducted for 2 hours.

The polyimide precursor film thus treated was heated to 380° C. at a reduced pressure of 1.33 Pa to obtain a porous polyimide film having a thickness of 10 μm. An SEM image of a section of the porous object film obtained was processed to determine the cell size (average cell diameter), which was found to be 0.83 μm. This porous object film had a dielectric constant ξ of 2.97 (measuring frequency, 1 MHz). The interaction parameter $\chi_{AB}$ between the polyimide precursor and dispersible compound (polyethylene glycol diacrylate) used here was 11.18.

Comparative Example 1

A polyethylene glycol (trade name "PEG200", manufactured by Nippon Oil & Fats Co., Ltd.) having a weight average molecular weight of 200 was added to the polyimide precursor solution obtained in Synthesis Example 1, in an amount of 38 parts by weight per 100 parts by weight of the polyimide precursor. The resulting mixture was stirred to obtain a transparent homogeneous solution. This solution was applied to a 25 μm thick stainless-steel foil (SUS304) with a spin coater in such an amount as to result in a polyimide precursor film having a thickness of 15 μm on a dry basis. The coating was dried in a circulating hot-air oven first at 90° C. for 15 minutes and then at 180° C. for 10 minutes to remove the solvent. Thus, a polyimide precursor film was obtained.

This polyimide precursor film was cut into a sheet having dimensions of 50 mm by 100 mm. This sheet was placed in a 500-mL pressure vessel, and the vessel was filled with supercritical carbon dioxide pressurized to 25 MPa in a 100° C. atmosphere. Thereafter, supercritical carbon dioxide was injected into and discharged from the vessel at a rate of about 3 liters/min in terms of gas amount while maintaining the pressure. This operation for extracting the polyethylene glycol was conducted for 2 hours.

The polyimide precursor film thus treated was heated to 380° C. at a reduced pressure of 1.33 Pa to obtain a polyimide film having a thickness of 10 μm. An SEM image of a section of the resultant film showed that the film had no cells inside. This film had a dielectric constant ξ of 3.20 (measuring frequency, 1 MHz), which was the same as that of a blank polyimide. The interaction parameter $\chi_{AB}$ between the polyimide precursor and polyethylene glycol used here was 0.53.

Comparative Example 2

A polyethylene glycol monomethacrylate (trade name "PE-200", manufactured by Nippon Oil & Fats Co., Ltd.) having a weight average molecular weight of 200 was added to the polyimide precursor solution obtained in Synthesis Example 1, in an amount of 38 parts by weight per 100 parts by weight of the polyimide precursor. The resulting mixture was stirred to obtain a transparent homogeneous solution. This solution was applied to a 25 μm thick stainless-steel foil (SUS304) with a spin coater in such an amount as to result in a polyimide precursor film having a thickness of 15 μm on a dry basis. The coating was dried in a circulating hot-air oven first at 90° C. for 15 minutes and then at 180° C. for 10 minutes to remove the solvent. Thus, a polyimide precursor film was obtained.

This polyimide precursor film was cut into a sheet having dimensions of 50 mm by 100 mm. This sheet was placed in a 500-mL pressure vessel, and the pressure inside the vessel was elevated to 25 MPa in a 100° C. atmosphere. Thereafter, supercritical carbon dioxide was injected into and discharged from the vessel at a rate of about 3 liters/min in terms of gas amount while maintaining the pressure. This operation for extracting the polyethylene glycol monomethacrylate was conducted for 2 hours.

The polyimide precursor film thus treated was heated to 380° C. at a reduced pressure of 1.33 Pa to obtain a polyimide film having a thickness of 10 μm. An SEM image of a section of the resultant film showed that the film had no cells inside. This film had a dielectric constant ξ of 3.20 (measuring frequency, 1 MHz). The interaction parameter $\chi_{AB}$ between the polyimide precursor and polyethylene glycol monomethacrylate used here was 2.13.

The results given above show that the porous polyimide films obtained in the Examples of the invention each had a finely cellular structure with a cell size smaller than 5 μm and had a low dielectric constant.

According to the process of the invention for porous-polyimide production, a heat-resistant porous object having a finely cellular structure and a low dielectric constant can be produced easily and efficiently, because a polymer composition having a specific micro-domain structure is formed and the ingredient constituting the discontinuous phase is removed therefrom. The porous object of the invention has an exceedingly small cell size and a low dielectric constant, and is hence extremely useful as an internal insulator, buffering material, or circuit substrate in electronic appliances, etc.

What is claimed is:

1. A process for producing a porous polyimide which comprises preparing a polymer composition having a micro-domain structure made up of a continuous phase comprising a polyimide precursor A and, dispersed therein, a discontinuous phase which comprises a dispersible compound B and has an average diameter smaller than 10 $\mu$m, removing the dispersible compound B from the polymer composition, and then converting the polyimide precursor A into a polyimide, an interaction parameter $\chi_{AB}$ between the polyimide precursor A and the dispersible compound B being larger than 3.

2. The process for producing a porous polyimide of claim 1, wherein the removal of the dispersible compound B is conducted by an extraction operation.

3. The process for producing a porous polyimide of claim 2, wherein supercritical carbon dioxide is used as an extraction solvent for the dispersible compound B.

4. A porous polyimide obtained by the process of any one of claims 1 to 3, the porous polyimide having an average cell diameter smaller than 5 $\mu$m and a dielectric constant of 3 or lower.

* * * * *